United States Patent
Hu et al.

(10) Patent No.: US 12,550,437 B2
(45) Date of Patent: Feb. 10, 2026

(54) DISPLAY PANEL AND DISPLAY DEVICE

(71) Applicant: Wuhan China Star Optoelectronics Semiconductor Display Technology Co., Ltd., Hubei (CN)

(72) Inventors: Peng Hu, Hubei (CN); Fan Zhang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 767 days.

(21) Appl. No.: 17/795,548

(22) PCT Filed: Jun. 8, 2022

(86) PCT No.: PCT/CN2022/097630
§ 371 (c)(1),
(2) Date: Jul. 27, 2022

(87) PCT Pub. No.: WO2023/226089
PCT Pub. Date: Nov. 30, 2023

(65) Prior Publication Data
US 2024/0186334 A1  Jun. 6, 2024

(30) Foreign Application Priority Data
May 27, 2022  (CN) .......................... 202210592005.2

(51) Int. Cl.
  H10D 86/60  (2025.01)
  H10D 86/40  (2025.01)
(52) U.S. Cl.
  CPC ........... *H10D 86/60* (2025.01); *H10D 86/443* (2025.01)

(58) Field of Classification Search
  CPC .... G09F 9/301; G09G 3/035; G09G 2380/02; H10K 77/111; H10K 2102/311; H10D 86/40–60
  See application file for complete search history.

(56) References Cited

U.S. PATENT DOCUMENTS

| 11,502,137 B2 | 11/2022 | Yang et al. |
| 11,806,974 B2 | 11/2023 | Cao et al. |

(Continued)

FOREIGN PATENT DOCUMENTS

| CN | 107742623 | 2/2018 |
| CN | 108445686 | 8/2018 |

(Continued)

OTHER PUBLICATIONS

International Search Report and the Written Opinion Dated Dec. 19, 2022 From the International Searching Authority Re. Application No. PCT/CN2022/097630 and Its Translation Into English. (19 Pages).

(Continued)

*Primary Examiner* — Sue A Purvis
*Assistant Examiner* — Aneta B Cieslewicz (57) ABSTRACT

A display panel and a display device are provided. The display panel includes a base substrate and a signal wiring disposed on the base substrate. The base substrate includes a first bending area and a second bending area adjoining each other, and a corner area located between the first bending area and the second bending area. The signal wiring includes a first line and a bridge line connected to the first line. The first line is located in the first bending area, the bridge line is located in the corner area, and elongation of the bridge line is greater than elongation of the first line.

20 Claims, 7 Drawing Sheets

(56) References Cited

U.S. PATENT DOCUMENTS

| | | | |
|---|---|---|---|
| 12,193,255 | B2 | 1/2025 | Liu et al. |
| 2019/0108793 | A1 | 4/2019 | Kim et al. |
| 2019/0393294 | A1* | 12/2019 | Song ................... H10D 86/60 |
| 2021/0376040 | A1* | 12/2021 | Youn ................. H10K 59/1315 |
| 2021/0378107 | A1* | 12/2021 | Hwang ............. G02F 1/133331 |
| 2021/0384466 | A1* | 12/2021 | Liu .......................... G09F 9/33 |
| 2024/0196682 | A1* | 6/2024 | Cheng .................. H10K 59/131 |

FOREIGN PATENT DOCUMENTS

| | | |
|---|---|---|
| CN | 109859625 | 6/2019 |
| CN | 110534027 | 12/2019 |
| CN | 110867472 | 3/2020 |
| CN | 110943114 | 3/2020 |
| CN | 112053632 | 12/2020 |
| CN | 112071883 | 12/2020 |
| CN | 112885844 | 6/2021 |
| CN | 113410275 | 9/2021 |
| CN | 114072869 | 2/2022 |

OTHER PUBLICATIONS

Notification of Office Action and Search Report Dated Apr. 22, 2025 From The State Intellectual Property Office of the People's Republic of China Re. Application No. 202210592005.2 and Its Translation Into English. (15 Pages).

* cited by examiner

DISPLAY PANEL AND DISPLAY DEVICE

RELATED APPLICATIONS

This application is a National Phase of PCT Patent Application No. PCT/CN2022/097630 having International filing date of Jun. 8, 2022, which claims the benefit of priority of Chinese Patent Application No. 202210592005.2 filed on May 27, 2022. The contents of the above applications are all incorporated by reference as if fully set forth herein in their entirety.

BACKGROUND OF INVENTION

Field and Background of the Invention

The present application relates to a technical field of displays, and particularly to a display panel and a display device.

In order to further increase screen ratios of electronic devices, four-curved side products are developed accordingly, long and short sides of covers of the four-curved side products are curved. Traditional four-curved side products are mainly designed with large rounded corners. When four corner areas are displayed, there will be obvious blemishes, and module borders at front viewing angles will be significantly enlarged in size. In order to improve overall display effects of four-curved side products, terminal manufacturers put forward the demand for Gaussian four-curved side products of so-called "soap box" type, of which four corner areas are spherical. Each corner area is called a "Gaussian surface" because of curvature change in two directions, that is, the Gaussian curvature. Due to inherent characteristics, spherical surfaces cannot be expanded to be flat, so that when display panels are attached to the Gaussian surfaces, corner areas of the display panels are prone to creases, causing signal lines to break easily.

SUMMARY OF THE INVENTION

The present application provides a display panel to solve a problem that when conventional four-curved side display panels are attached to covers, corner areas of the display panels are prone to creases, causing signal lines to break easily.

The present application provides a display panel, including a base substrate comprising a flat display area and a bending area surrounding the flat display area. The flat display area includes a first side and a second side adjoining the first side, the bending area comprising a first bending area bent along the first side, a second bending area bent along the second side, and a corner area located between the first bending area and the second bending area, and at least a signal wiring disposed on the base substrate and including a first line and a bridge line connected to the first line. The first line is located in the first bending area, the bridge line is located in the corner area, and elongation of the bridge line is greater than elongation of the first line.

Optionally, in some embodiments of the present application, the bridge line includes a first bridge line, a second bridge line, and a third bridge line connecting with the first bridge line and the second bridge line, and the second bridge line is connected to the first trace.

The first bridge line is arranged parallel to the first side, and the second bridge line is arranged parallel to the second side.

Optionally, in some embodiments of the present application, a first vertical distance is defined between one end of the first bridge line close to the second side and the second side, and a second vertical distance is defined between one end of the second bridge line close to the first side and the first side.

Each of the first vertical distance and the second vertical distance is greater than 0.2 millimeters (mm), and a difference between the first vertical distance and the second vertical distance is less than 0.1 mm in absolute terms.

Optionally, in some embodiments of the present application, the signal wiring further includes a second line. The second line is located in the second bending area and is connected to the first line, the first line and the second line are disposed in a same layer, and the first line and the bridge line are disposed in a different layer.

Optionally, in some embodiments of the present application, an angle defined between the first line and the second bridge line is equal to an angle defined between the second line and the first bridge line.

Optionally, in some embodiments of the present application, the display panel further includes a plurality of the signal wirings. Among the signal wirings, a plurality of the first bridge lines are arranged in parallel, a plurality of the second bridge lines are arranged in parallel, and a plurality of the third bridge lines are arranged in parallel.

Optionally, in some embodiments of the present application, the display panel further includes a gate metal layer and a first source-drain metal layer, wherein the gate metal layer is disposed on the base substrate, and the first source-drain metal layer is disposed on a side of the gate metal layer away from the base substrate.

The first line and the second line are disposed in the same layer as the gate metal layer, the bridge line is disposed in a same layer as the first source-drain metal layer, and the first line and the second line are connected to the bridge line through corresponding first contact holes, respectively.

Optionally, in some embodiments of the present application, the display panel further includes an interlayer dielectric layer disposed on the gate metal layer. The first source-drain metal layer is disposed on a side of the interlayer dielectric layer away from the base substrate, a plurality of the first contact holes are located in the interlayer dielectric layer, and each of the first contact holes extends through the interlayer dielectric layer to a side of the first line or the second line away from of the base substrate.

Optionally, in some embodiments of the present application, the display panel further includes a gate metal layer, a capacitor metal layer, a first source-drain metal layer, and a second source-drain metal layer. The gate metal layer is disposed on the base substrate, the capacitor metal layer is arranged on a side of the gate metal layer away from the base substrate, and the first source-drain metal layer is disposed on a side of the capacitor metal layer away from the base substrate, and the second source-drain metal layer is disposed on a side of the first source-drain metal layer away from the base substrate;

Each of the first line and the second line is disposed in a same layer as the gate metal layer or the capacitor metal layer, the bridge line is disposed in a same layer as the first source-drain metal layer or the second source-drain metal layer, and the first line and the second line are connected to the bridge line through corresponding second contact holes, respectively.

Optionally, in some embodiments of the present application, the display panel further includes an interlayer dielectric layer disposed on the capacitor metal layer, and a first planarization layer disposed on the interlayer dielectric layer and covering the first source-drain metal layer. The second source-drain metal layer is disposed on a side of the first planarization layer away from the base substrate, a plurality of the second contact holes are located on the first planarization layer, and each of the second contact holes extends through the first planarization layer to a side of the first line or the second line away from the base substrate.

Optionally, in some embodiments of the present application, the bridge line is provided with at least one groove.

Optionally, in some embodiments of the present application, a plurality of the grooves are located at the bridge line and pass through the bridge line and are arranged in a straight line pattern or in a chain-like pattern on the bridge line.

Optionally, in some embodiments of the present application, the display panel further includes two signal wirings spaced apart from each other, wherein one of the signal wirings is a scan signal control line and the other is an emission signal control line, wherein the display panel further comprises a first gate driver on array (GOA) circuit and a second GOA circuit arranged in the bending area, the first GOA circuit is connected to the scan signal control line, and the second GOA circuit is connected to the emission signal control line.

Optionally, in some embodiments of the present application, the first GOA circuit is disposed in the first bending area and the second bending area, and the second GOA circuit is disposed in the first bending area and the second bending area.

Optionally, in some embodiments of the present application, the second GOA circuit is disposed on a side of the first GOA circuit away from the flat display area, the scan signal control line is disposed between the first GOA circuit and the second GOA circuit, and the emission signal control line is arranged on a side of the second GOA circuit away from the flat display area.

Optionally, in some embodiments of the present application, the display panel further includes a positioning mark located in the corner area.

Optionally, in some embodiments of the present application, a vertical distance between the positioning mark and the bridge line in an extending direction of the first side is greater than 0.2 microns, and a vertical distance between the positioning mark and the bridge line in an extending direction of the second side is greater than 0.2 microns.

Correspondingly, the present application further provides a display device, including a display panel and a cover. The cover is disposed on the display panel, and the display panel is any one of the above-mentioned display panels.

The present application has advantageous effects as follows: the present application provides a display panel and a display device. The display panel includes a base substrate and at least a signal wiring disposed on the base substrate. The base substrate includes a flat display area and a bending area surrounding the flat display area. The flat display area includes a first side and a second side adjoining the first side. The bending area includes a first bending area bent along the first side, a second bending area bent along the second side, and a corner area located between the first bending area and the second bending area. The signal wiring includes a first line and a bridge line connected to the first line. The first line is located in the first bending area, the bridge line is located in the corner area, and elongation of the bridge line is greater than elongation of the first line. The signal wiring is embodied as the first line and the bridge line connected to each other. Since the bridge line is located in the corner area, and the elongation of the bridge line is greater than that of the first line, bending resistance of the signal wiring in the corner area can be improved, and creases occurring in the corner area can be prevented from breaking the signal wiring, thereby improving the yield of the display panel.

BRIEF DESCRIPTION OF THE SEVERAL VIEWS OF THE DRAWINGS

In order to better illustrate the technical solutions in the embodiments of the present application, the following will briefly introduce the accompanying drawings that need to be used in the description of the embodiments. Apparently, the accompanying drawings in the following description show merely some embodiments of the present invention, and a person skilled in the art may still derive other drawings from these accompanying drawings without creative efforts.

DESCRIPTION OF SPECIFIC EMBODIMENTS OF THE INVENTION

The technical solutions in the embodiments of the present application will be clearly and completely described below with reference to the drawings in the embodiments of the present application. Obviously, the described embodiments are only a part of the embodiments of the present application, rather than all the embodiments.

In the description of this application, it should be understood that the terms "first" and "second" are only used for descriptive purposes and are not to be construed as indicating or implying relative importance. Thus, features defining "first" and "second" may include one or more of the described features either explicitly or implicitly and therefore cannot be understood as a restriction on this application.

The present application provides a display panel and a display device, which will be described in detail below. It should be noted that the description order of the following embodiments does not serve as a limitation on the preferred order of the embodiments of the present application.

Figure 1:
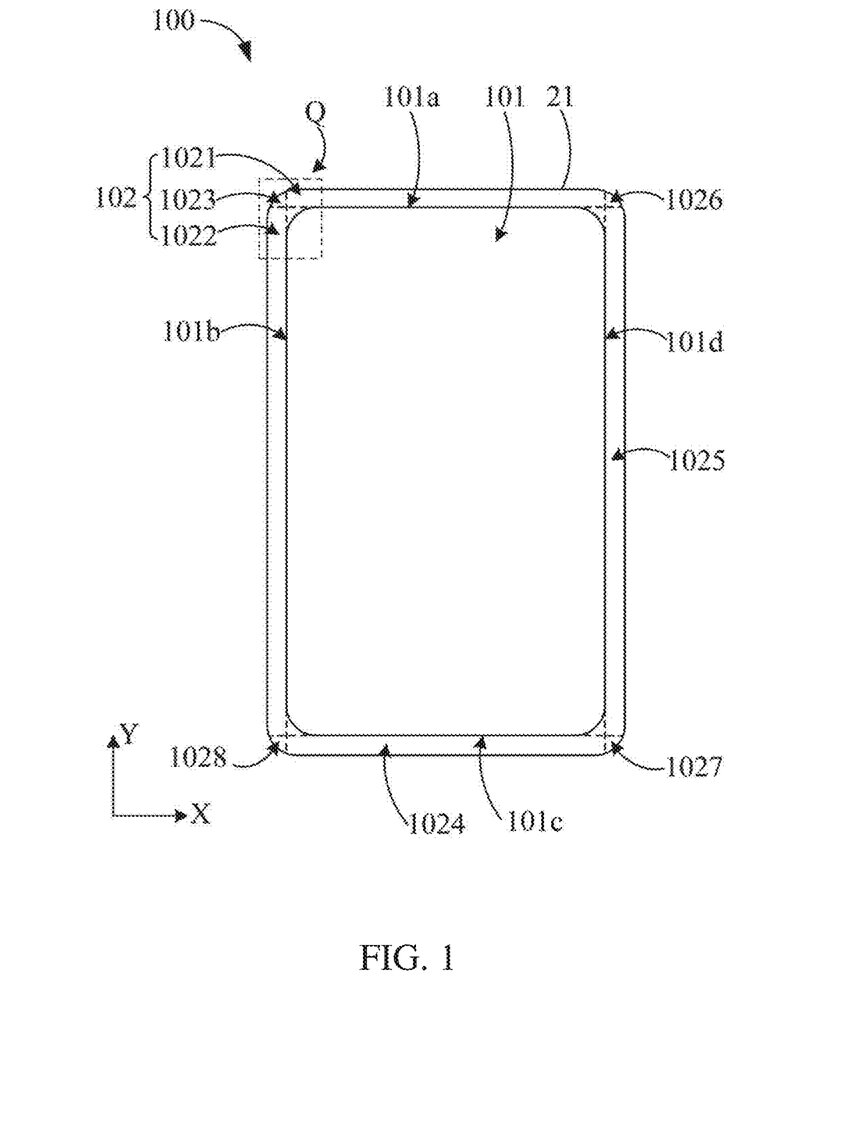
FIG. 1 is a schematic structural plan view of a display panel of the present application.
Figure 2:
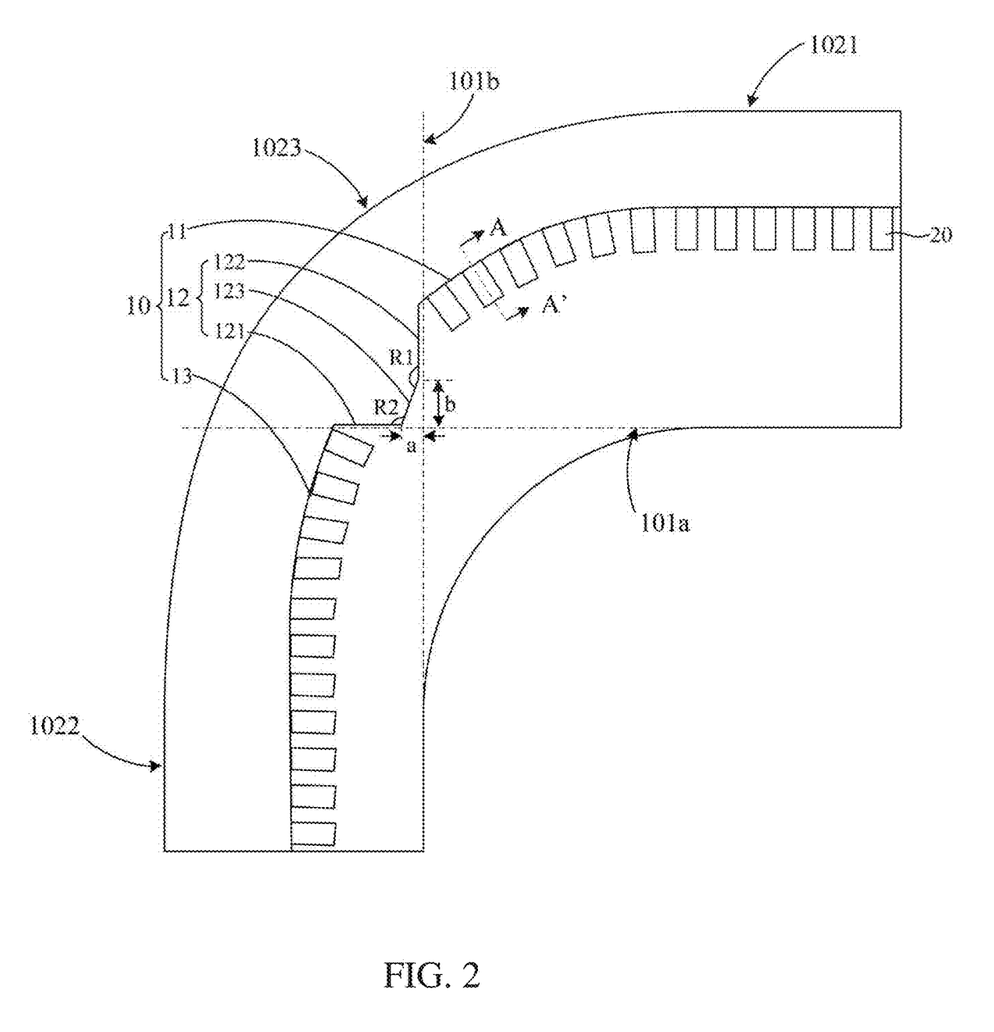
FIG. 2 is a schematic first enlarged structural view of a Q area indicated in FIG. 1 of the present application.

Please refer to FIGS. 1 and 2. FIG. 1 is a schematic structural plan view of a display panel of the present application. FIG. 2 is a schematic first enlarged structural view of a Q area indicated in FIG. 1 of the present application. In the embodiment of the present application, the display panel 100 includes a base substrate 21 and at least one signal wiring 10.

Specifically, the base substrate 21 includes a flat display area 101 and a bending area 102 surrounding the flat display area 101. The flat display area 101 includes a first side 101a and a second side 101b adjoining the first side 101a. The bending area 102 includes a first bending area 1021 bent along the first side 101a, a second bending area 1022 bent along the second side 101b, and a corner area 1023 located between the first bending area 1021 and the second bending area 1022.

Specifically, the signal wiring 10 is disposed on the base substrate 21. The signal wiring 10 includes a first line 11 and a bridge line 12 connected to the first line 11. The first line 11 is located in the first bending area 1021. The bridge line 12 is located in the corner area 1023. Elongation of the bridge line 12 is greater than elongation of the first line 11.

Since part of the signal wiring 10 is arranged in the corner area 1023, the embodiment of the present application sets the signal wiring 10 as the first line 11 and the bridge line 12 which are connected to each other. Specifically, the bridge line 12 is located in the corner area 1023. Since the elongation of the bridge line 12 is relatively large, bending resistance of the signal wiring 10 in the corner area 1023 can be improved, thereby preventing the bridge line 12 from being broken due to folds in the corner area 1023, thus further preventing breakage of the signal wiring 10, and improving a yield of the display panel 100.

In this embodiment of the present application, the bending area 102 may be a non-display area. Certainly, in some embodiments of the present application, subpixels may also be arranged in the bending area 102. In this case, image can also be displayed in the bending area 102 to achieve a full screen.

In the embodiment of the present application, a material of the first line 11 may be molybdenum. A material of the bridge line 12 can be a conductive material with high strength and high elongation, such as aluminum and titanium, so as to ensure the high elongation of the bridge line 12. For example, the bridge line 12 may be a stacked structure of aluminum/titanium/aluminum. Certainly, in the present application, the material of the first line 11 and the bridge line 12 can also be set to be the same, and then the elongation of the bridge line 12 can be improved by improving the structure of the bridge line 12, which is not limited in the present application.

In the embodiment of the present application, the bridge line 12 includes a first bridge line 121, a second bridge line 122 connected to the first line 11, and a third bridge line 123 connect with the first bridge line 121 and the second bridge line 122. Specifically, the first bridge line 121 is arranged parallel to the first side 101a. The second bridge line 122 is arranged parallel to the second side edge 101b.

It can be understood that, the corner area 1023 is provided with curvature changes in two directions, that is, gaussian curvature. In the related art, wirings in the corner area 1023 are affected by the Gaussian curvature and are easily broken.

In the embodiment of the present application, the first bridge line 121 is arranged to be parallel to the first side 101a, which can reduce the influence of the curvature change at the second side 101b on bending stress generated by the first bridge line 121. Therefore, it is ensured that the first bridge line 121 is only affected by a single curvature change, and the stress on the first bridge line 121 is reduced. Likewise, in the embodiment of the present application, the second bridge line 122 is arranged to be parallel to the second side 101b, which can reduce the influence of the curvature change at the first side 101a on bending stress generated by the second bridge line 122. Therefore, it is ensured that the second bridge line 121 is only affected by a single curvature change, and the stress on the second bridge line 122 is reduced. In this manner, the embodiment of the present application can reduce the overall stress on the bridge line 12 and prevent the bridge line 12 from breaking in the corner area 1023.

In the present application, a first vertical distance a is defined between one end of the first bridge line 121 close to the second side 101b and the second side 101b. A second vertical distance b is defined between one end of the second bridge line 122 close to the first side 101a and the first side 101a. Specifically, the first vertical distance a and the second vertical distance b are both greater than 0.2 millimeters (mm). An absolute value of a difference between the first vertical distance a and the second vertical distance b is less than 0.1 mm.

For example, the first vertical distance a may be 0.2 mm, 0.3 mm, 0.5 mm, or the like. The second vertical distance b may be 0.2 mm, 0.3 mm, 0.5 mm, or the like. The absolute value of the difference between the first vertical distance a and the second vertical distance b may be 0, 0.1 mm, 0.05 mm, and the like. In addition, a length of the first bridge line 121 and a length of the second bridge line 122 depend on an area of the corner area 1023.

In the embodiment of the present application, since the third bridge line 123 is located between the first bridge line 121 and the second bridge line 122, the third bridge line 123 is thus closer to the flat display area 101. By setting the first vertical distance a and the second vertical distance b both to be greater than 0.2 mm, and the absolute value of the difference between the first vertical distance a and the second vertical distance b is less than 0.1 mm, the third bridge line 123 can be prevented from entering the flat display area 101 due to fit deviation, and the influence of the Gaussian curvature on the third bridge line 123 can be reduced at the same time.

In the embodiment of the present application, the signal wiring 10 further includes a second line 13. The second line 13 is located in the second bending area 1022. The bridge line 12 connects the first line 11 to the second line 13. The first line 11 and the second line 13 are disposed in a same layer. The first line 11 and the bridge line 12 are disposed in different layers.

It can be understood that, since the elongation of the bridge line 12 is greater than that of the first line 11, the material of the bridge line 12 may be different from the material of the first line 11. In the embodiment of the present application, the first line 11 and the bridge line 12 are arranged in different layers which can be made of different materials, thereby forming the first line 11, the bridge line 12, and the second line 13. In addition, since the first line 11 and the bridge line 12 are disposed in different layers, the first line 11, the bridge line 12, and the second line 13 can also be formed by using existing functional film layers in the display panel 100, thereby simplifying processes and reducing thickness of the display panel 100.

In the present application, an angle R1 formed between the third bridge line 123 and the second bridge line 122 is equal to an angle R2 formed between the third bridge line 123 and the first bridge line 121.

For example, the angle R1 between the third bridge line 123 and the second line 122 and the angle R2 between the third bridge line 123 and the first bridge line 121 are both is 135 degrees. Since the first bridge line 121 is arranged in parallel with the first side 101a and the second bridge line 122 is arranged in parallel with the second side 101b, the lengths of the first bridge line 121 and the second bridge line 122 are the same. In this case, the bending stress on the first bridge line 121 and the second bridge line 122 is almost equal, thereby reducing and improving overall breakage probability of the signal wiring 10.

Figure 3:
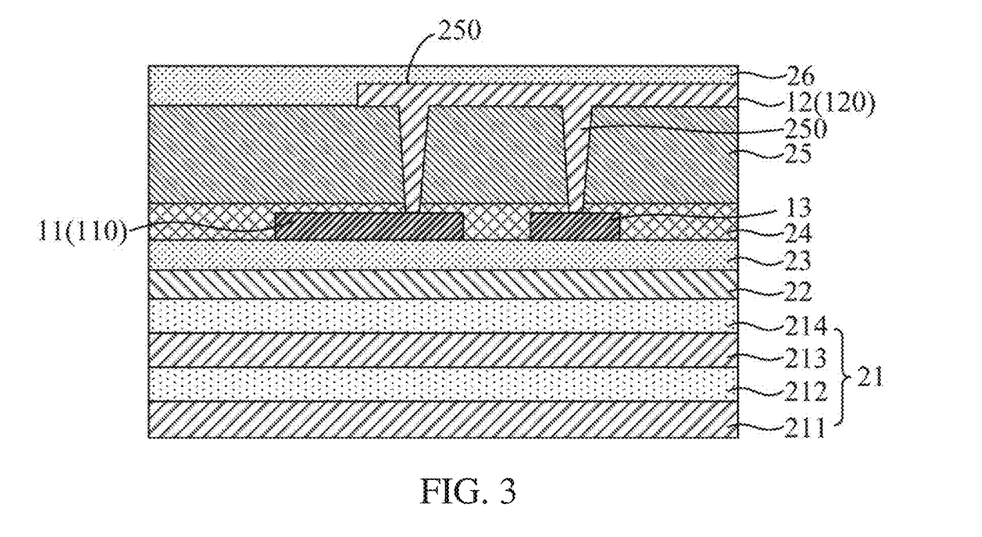
FIG. 3 is a schematic first cross-sectional view taken along line AA' of FIG. 2 of the present application.

Specifically, please refer to FIGS. 1 to 3. FIG. 3 is a schematic first cross-sectional view taken along line AA' of FIG. 2 of the present application. In the light-emitting direction of the display panel 100, the display panel 100 includes a buffer layer 22, a first gate insulating layer 23, a gate metal layer 110, an interlayer dielectric layer 25, and a first source-drain metal layer 120, which are stacked on the base substrate 21.

The base substrate 21 may be a flexible substrate that can be bent, folded, or rolled. The base substrate 21 may include one layer, two layers, or more than two layers of flexible polyimide (PI). The base substrate 21 may also be made of an insulating material such as a polymer resin. The base substrate 21 mainly plays the role of carrying and protecting functional film layers, so as to improve the structural stability of the display panel 100. For example, in the present application, the base substrate 21 includes a first PI layer 211, a first polybutylene (PB) layer 212, a second PI layer 213, and a second PB layer 214. Certainly, the present application is not limited to thereto.

The gate metal layer 110 mainly includes a gate electrode, a scan line, etc. of a transistor. The first source-drain metal layer 120 mainly includes a source electrode, a drain electrode, a data line, etc. of the transistor.

In the present application, the first line 11 and the second line 13 are both disposed in a same layer as the gate metal layer 110. The bridge line 12 is disposed in a same layer as the first source-drain metal layer 120. A plurality of first contact holes 250 are located in the interlayer dielectric layer 25. Each of the first contact holes 250 extends through the interlayer dielectric layer 25 to a side of the first line 11 or the second line 13 away from the base substrate 21. Each of the first contact holes 250 exposes a side surface of the first line 11 or the second line 13 away from the base substrate 21. The first lines 11 and the second lines 13 are connected to the bridge line 12 through corresponding first contact holes 250, respectively. FIG. 3 only shows the connection between the first line 11 and the bridge line 12, but it should not be understood as a limitation of the present application.

The embodiments of the present application can simplify the process of the display panel 100 and reduce the thickness of the display panel 100. In addition, since the gate metal layer 110 is generally formed by using molybdenum-based wirings that are not resistant to bending, in actual products, the corner area 1023 is prone to creases, causing the signal wiring 10 to be broken, resulting in an abnormal picture. The first source-drain metal layer 120 is generally made of materials such as aluminum and titanium with high strength and high elongation. By means of changing lines in the embodiment of the present application, part of the signal wiring 10 located in the corner area 1023 is replaced by the bridge line 12 configured in the same layer as the first source-drain metal layer 120, which can improve the bending resistance of the signal wiring 10.

Further, in the present application, the display panel 100 further includes a second gate insulating layer 24 and a first planarization layer 26. The second gate insulating layer 24 is disposed on a side of the gate metal layer 110 away from the base substrate 21. The second gate insulating layer 24 covers the gate metal layer 110. The first planarization layer 26 is disposed on a side of the first source-drain metal layer 120 away from the base substrate 21. The first planarization layer 26 covers the first source-drain metal layer 120.

Figure 4:
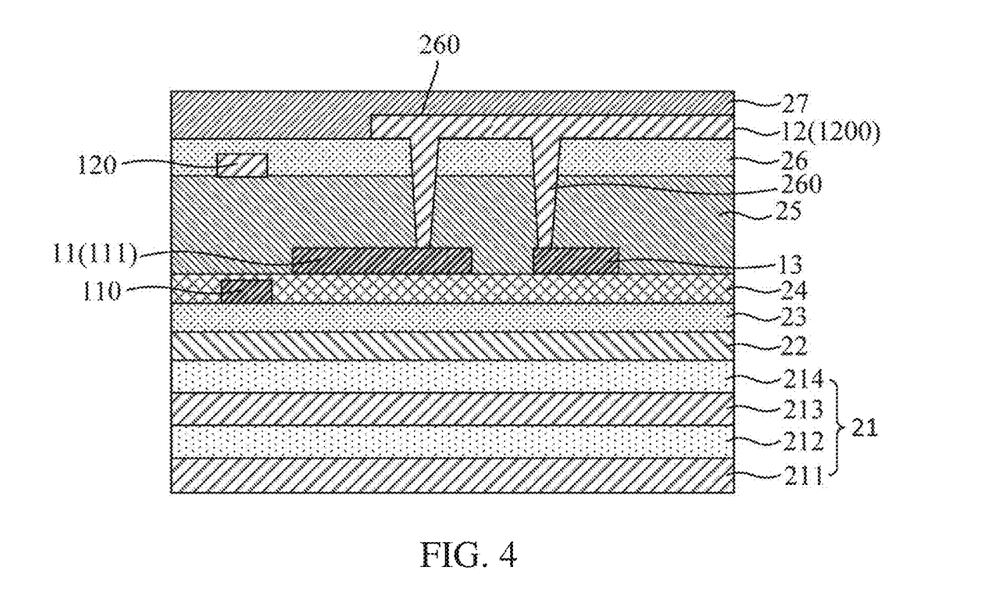
FIG. 4 is a schematic second cross-sectional view taken along line AA' of FIG. 2 of the present application.

In some embodiments of the present application, please refer to FIG. 3 to FIG. 4. FIG. 4 is a schematic second cross-sectional view taken along line AA' of FIG. 2 of the present application. The cross-sectional structure of the display panel 100 shown in FIG. 3 differs from this embodiment is that the display panel 100 further includes a capacitor metal layer 111, a second source-drain metal layer 1200, and a second planarization layer 27.

The capacitor metal layer 111 is disposed between the second gate insulating layer 24 and the interlayer dielectric layer 25. The capacitor metal layer 111 mainly includes one electrode plate of the capacitor and can form a storage capacitor with a metal block in the gate metal layer 110. The second source-drain metal layer 1200 is disposed on a side of the first planarization layer 26 away from the base substrate 21. The second planarization layer 27 is disposed on a side of the second source-drain metal layer 1200 away from the second source-drain metal layer 1200. The second planarization layer 27 covers the second source-drain metal layer 1200.

It can be understood that, in the display panel 100 of some embodiments of the present application, in order to improve resolution of the display panel 100, it is necessary to reduce size of the transistor. In order to improve performance of the transistor and reduce impedance, a dual-layer source and drain can be employed. That is, the second source-drain metal layer 1200 mainly includes the source electrode of the transistor, the drain electrode of the transistor, and the like. The source electrode in the second source-drain metal layer 1200 is connected to the source electrode in the first source-drain metal layer 120 through a contact hole. The drain electrode in the second source-drain metal layer 1200 is connected to the drain electrode in the first source-drain metal layer 120 through a contact hole.

In the display panel 100 with the above structure, the first line 11 and the second line 13 may be disposed in the same layer as the gate metal layer 110 or the capacitor metal layer 111. The bridge line 12 may be disposed in the same layer as the first source-drain metal layer 120 or the second source-drain metal layer 1200.

Specifically, as shown in FIG. 4, the first line 11 and the second line 13 are disposed in the same layer as the capacitor metal layer 111. The bridge line 12 is disposed in the same layer as the second source-drain metal layer 1200. A plurality of second contact holes 260 are formed in the first planarization layer 26. The second contact holes 260 each extend through the first planarization layer 26 to the side of the first line 11 or the second line 13 away from the base substrate 21. Each of the second contact holes 260 exposes a side surface of the corresponding first line 11 or the second line 13 away from the base substrate 21. The first lines 11 and the second lines 13 are connected to the bridge line 12 through corresponding second contact holes 260, respectively. FIG. 3 only shows the connection between the first line 11 and the bridge line 12, but it should not be understood as a limitation of the present application.

Figure 5:
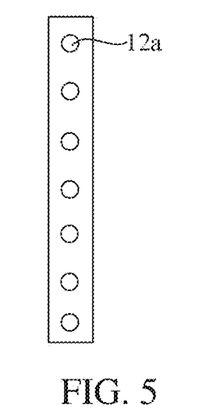
FIG. 5 is a schematic first partial structural view of a bridge line of FIG. 2 of the present application.

Referring to FIG. 5, FIG. 5 is a schematic first partial structural view of a bridge line of FIG. 2 of the present application. In the present application, the bridge line 12 is provided with at least one groove 12a.

Specifically, the groove 12a may be a via hole extending through the bridge line 12. The groove 12a may also be an opening formed in the bridge line 12. A number of grooves 12a may be one, two, or more than two, and may be specifically set according to a length and width of the bridge line 12.

Specifically, a plane structure of the groove 12a may be in a form of a circle, a trapezoid, a rhombus, etc., which is not limited in this application.

In the embodiment of the present application, the groove 12a is formed in the bridge line 12, which is equivalent to a thinning process of the bridge line 12, so that the elongation of the bridge line 12 can be improved. In addition, the groove 12a can release the stress generated when creases occur in the corner area 1023, which further prevents the bridge line 12 from breaking.

In one embodiment of the present application, the groove 12a is a via hole extending through the bridge line 12. A plurality of the grooves 12a are arranged in a straight line pattern on the bridge line 12. Specifically, the grooves 12a arranged at equal intervals on the bridge line 12 can further relieve the stress on the bridge line 12 and improve the bending resistance of the bridge line 12.

Figure 6:
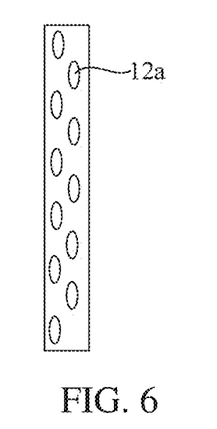
FIG. 6 is a schematic second partial structural view of the bridge line of FIG. 2 of the present application.

Referring to FIG. 6, FIG. 6 is a schematic second partial structural view of the bridge line of FIG. 2 of the present application. In this embodiment, the groove 12a is a via hole extending through the bridge line 12. A plurality of the grooves 12a are arranged in a chain-like pattern on the bridge line 12.

Specifically, the planar structure of the groove 12a may be in an elliptical shape or the like. By means of the chain-like arrangement, an area of the bridge line 12 can be effectively utilized and the number of the grooves 12a can be increased, thereby further dispersing the stress on the bridge line 12.

Figure 7:
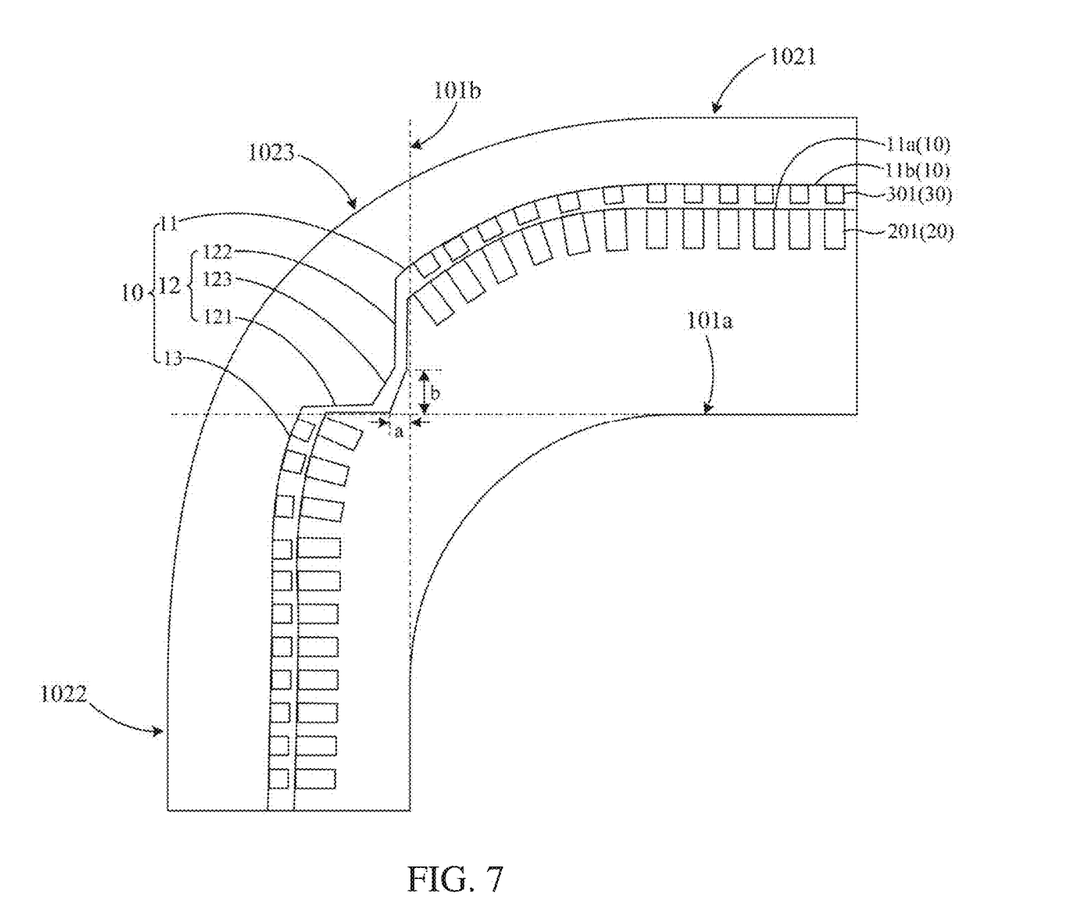
FIG. 7 is a schematic second enlarged structural view of the Q area indicated in FIG. 1 of the present application.

Referring to FIGS. 1 and 7, FIG. 7 is a schematic second enlarged structural view of the Q area indicated in FIG. 1 of the present application.

In the embodiment of the present application, the display panel 100 includes two signal wirings 10 arranged spaced apart from each other, one of which is a scan signal control line 11a, and the other is an emission signal control line 11b. The display panel 100 further includes a first gate driver on array (GOA) circuit 20 and a second GOA circuit 30 arranged in the bending area 102. The first GOA circuit 20 is connected to the scan signal control line 11a. The second GOA circuit 30 is connected to the emission signal control line 11b.

Specifically, a structure of the scan signal control line 11a and the emission signal control line 11b can be referred to the structure of the signal wiring 10 in the above-mentioned embodiment, and details are not repeated here.

The first GOA circuit 20 includes multi-stage cascaded first GOA units 201. The multi-stage cascaded first GOA units 201 may be disposed in predetermined areas of the corner area 1023, the first bending area 1021, and the second bending area 1022 along curvature of the corner area 1023.

Specifically, each first GOA unit 201 is connected to the scan signal control line 11a. Each first GOA unit 201 can generate a scan signal in response to a scan control signal from the scan signal control line 11a, and can output the scan signal to the flat display area 101.

Specifically, the second GOA circuit 30 includes multi-stage cascaded second GOA units 301. The multi-stage cascaded second GOA units 301 may be disposed in predetermined areas of the corner area 1023, the first bending area 1021, and the second bending area 1022 along the curvature of the corner area 1023. The first GOA circuit 20 and the second GOA circuit 30 are spaced apart from each other.

Specifically, each second GOA unit 301 is connected to the emission signal control line 11b. Each second GOA unit 201 can generate a light-emitting signal in response to an emission control signal from the emission signal control line 11b, and can output the light-emitting signal to the flat display area 101.

Specifically, in an embodiment of the present application, the second GOA circuit 30 is disposed on a side of the first GOA circuit 20 away from the flat panel display area 101. The scan signal control line 11a is disposed between the first GOA circuit 20 and the second GOA circuit 30. The emission signal control line 11b is disposed on a side of the second GOA circuit 30 away from the flat display area 101.

Certainly, in other embodiments of the present application, the second GOA circuit 30 may be disposed on a side of the first GOA circuit 20 close to the flat display area 101. The emission signal control line 11b is arranged between the first GOA circuit 20 and the second GOA circuit 30. The scan signal control line 11a is disposed on the side of the first GOA circuit 20 away from the flat panel display area 101.

Alternatively, the second GOA circuit 30 is disposed on the side of the first GOA circuit 20 away from the flat display area 101. The scan signal control line 11a and the emission signal control line 11b are both disposed on the side of the second GOA circuit 30 away from the flat display area 101.

In one embodiment of the present application, the first GOA circuit 20 and the second GOA circuit 30 are disposed in the first bending area 1021 and the second bending area 1022.

Since the signal wiring 10 (the scan signal control line 11a and the emission signal control line 11b) is disposed in a special-shaped arrangement in the corner area 1023, the first GOA circuit 20 and the second GOA circuit 30 are thus arranged in the first bending area 1021 and the second bending area 1022, so that defects caused by insufficient wiring space of the first GOA circuit 20 and the second GOA circuit 30 in the corner area 1023 can be prevented. In addition, the first GOA circuit 20 and the second GOA circuit 30 arranged in the first bending area 1021 and the second bending area 1022 can further avoid the Gaussian surface area, thus improving a wiring yield in the corner area 1023.

In addition, corresponding to the relevant scan signal or emission signal that should be provided by the first GOA unit 201 or the second GOA unit 301 located in the corner area 1023, the first GOA unit 201 and the second GOA unit 301 may be further arranged in the first bending area 1021 and the second bending area 1022 for compensation. Alternatively, the compensation may be achieved with signals from the rest of the area.

Please continue to refer to FIG. 1. In the embodiment of the present application, the flat display area 101 further includes a third side 101c and a fourth side 101d. The third side 101c is disposed opposite to the first side 101a. The fourth side 101d is disposed opposite to the second side 101b. The display panel 100 further includes a third bending area 1024, a fourth bending area 1025, a first corner area 1026, a second corner area 1027, and a third corner area 1028. The third bending area 1024 is bent along the third side 101c. The fourth bending area 1025 is bent along the fourth side 101d. The first corner area 1026 is located between the first bending area 1021 and the fourth bending area 1025. The second corner area 1027 is located between the third bending area 1024 and the fourth bending area 1025. The third bending area 1024 is located between the third bending area 1024 and the second bending area 1022.

Specifically, the third bending area 1024, the fourth bending area 1025, the first corner area 1026, the second corner area 1027, and the third corner area 1028 may also be provided with signal lines (not shown). An arrangement of the signal lines and the arrangement of the signal wiring 10 may be the same. Each embodiment of the present application takes the first bending area 1021, the second bending area 1022, the corner area 1023, and the signal trace 10 as examples for description, but it should not be construed as limitations of the present application.

Figure 8:
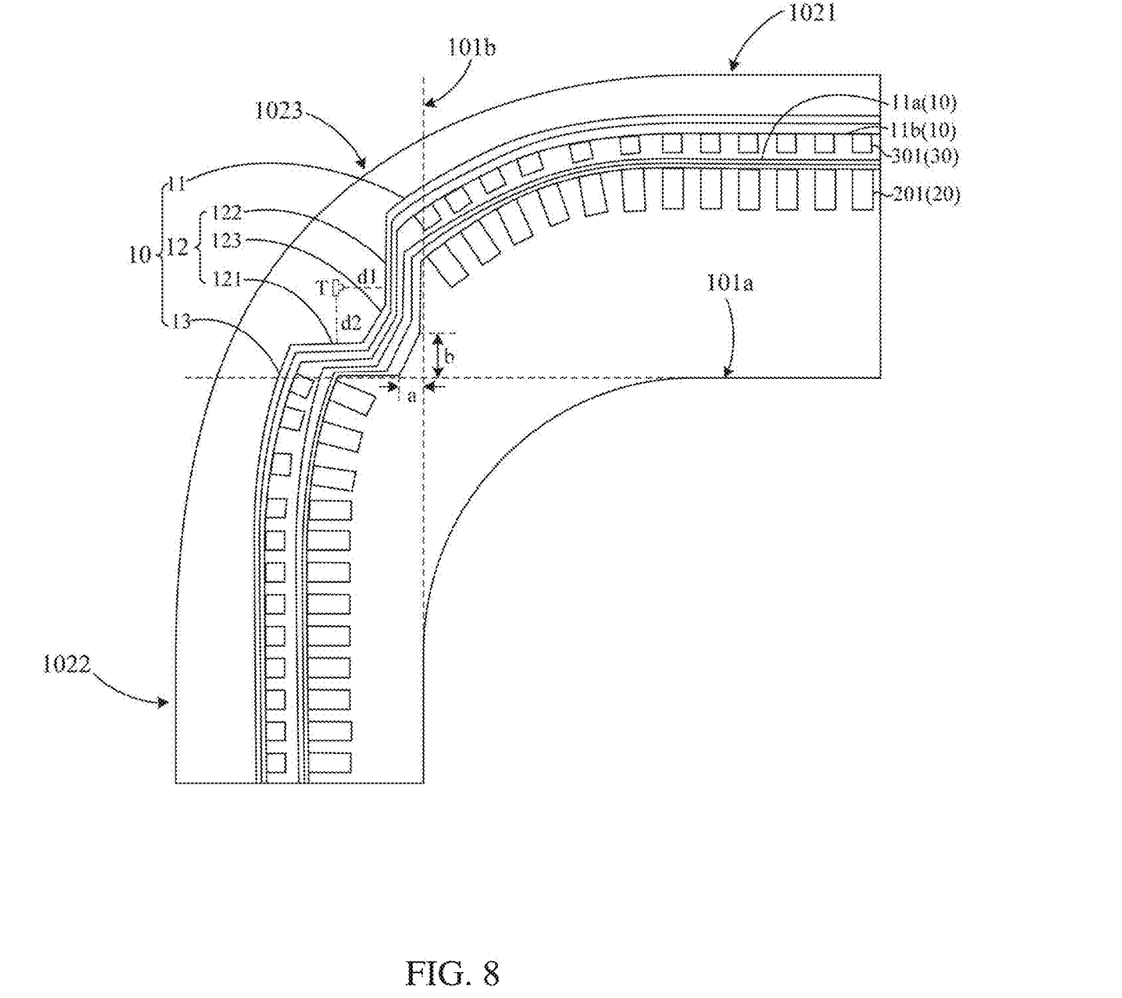
FIG. 8 is a schematic third enlarged structural view of the Q area indicated in FIG. 1 of the present application.

Please refer to FIGS. 1 and 8. FIG. 8 is a schematic third enlarged structural view of the Q area indicated in FIG. 1 of the present application.

In this embodiment of the present application, the display panel 100 includes a plurality of signal wirings 10. Each of the signal wirings 10 includes a first bridge line 121, a second bridge line 122, and a third bridge line 123 connecting with the first bridge line 121 and the second bridge line 122. Among the signal wirings 10, a plurality of the first bridge lines 121 are arranged in parallel, a plurality of the second bridge lines 122 are arranged in parallel, and a plurality of the third bridge lines 123 are arranged in parallel.

The embodiment of the present application can enhance the wiring regularity of each signal wiring 10, improve a space utilization rate, and prevent possible short circuit between each signal wiring 10.

It should be noted that, for the structure of the signal wiring 10 in the embodiment of the present application, reference may be made to the structure of the signal wiring 10 in the above-mentioned embodiment, which will not be repeated here. In addition, only six signal wirings 10 are shown in FIG. 8 to illustrate the solutions of the embodiments of the present application, but should not be construed as limitations on the present application.

In this embodiment of the present application, the display panel 100 further includes a positioning mark T. The positioning mark T is provided in the corner area 1023. The positioning marker T is configured for positioning and identification at subsequent bending sites.

It can be understood that the display panel 100 can reduce a bezel by bending a bonding area in position to a back. When bending, the positioning and bending can be performed by calculating and obtaining the position of the positioning mark T. By arranging the positioning mark T in the corner area 1023 in this embodiment of the present application, the positioning mark T can be prevented from occupying the flat display area 101.

Further, in the embodiment of the present application, in an extending direction of the first side 101a, a vertical distance between the positioning mark T and the bridge line 12 is greater than 0.2 microns. In an extending direction of the second side 101b, a vertical distance between the positioning mark T and the bridge line 12 is greater than 0.2 microns.

For example, in the extending direction of the first side 101a, the vertical distance between the positioning mark T and the bridge line 12 may be 0.2 micrometers, 0.25 micrometers, 0.5 micrometers, or the like. In the extending direction of the second side 101b, the vertical distance between the positioning mark T and the bridge line 12 may be 0.2 micrometers, 0.25 micrometers, 0.5 micrometers, or the like. There are no examples here.

By limiting the distance between the positioning mark T and the bridge line 12 in the embodiment of the present application, it is possible to prevent the positioning mark T from interfering with the bridge line T.

Correspondingly, the present application also provides a display device. The display device includes a display panel and a cover. The cover is disposed on the display panel. The display panel is the display panel 100 described in any one of the above, and details are not repeated here.

Specifically, the display device may be a smart phone, a tablet computer, an e-book reader, a smart watch, a video camera, a game console, etc., which is not limited in this application.

Figure 9:
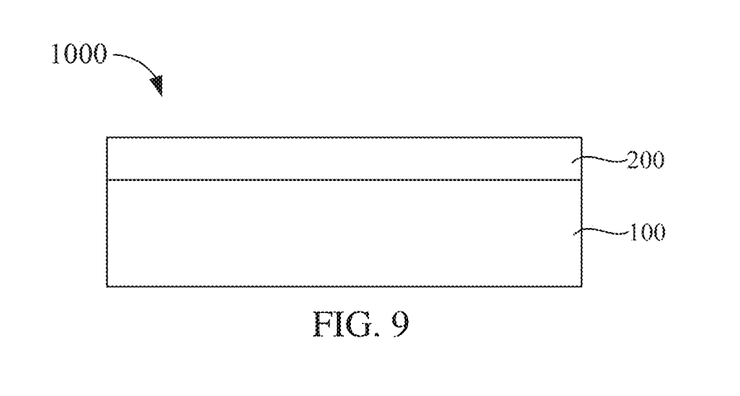
FIG. 9 is a schematic structural view of a display device of the present application.

Specifically, please refer to FIG. 9, which is a schematic structural view of the display device of the present application. The display device 1000 includes a display panel 100 and a cover 200. The cover 200 is disposed on the display panel 100.

Specifically, the cover 200 may be a four-curved glass cover. A forming process of the four-curved glass cover can be performed by hot bending of a single piece of glass. The single piece of flat glass is softened and bent at high temperature through a graphite die indenter with a specific required curvature.

An embodiment of the present application provide the display device 1000. The display device 1000 includes the display panel 100. The display panel 100 includes a base substrate and a signal wiring disposed on the base substrate. The base substrate includes a flat display area and a bending area surrounding the flat display area. The flat display area includes a first side and a second side adjoining the first side. The bending area includes a first bending area bent along the first side, a second bending area bent along the second side, and a corner area located between the first bending area and the second bending area. The signal wiring includes a first line and a bridge line connected to the first line. The first line is located in the first bending area, the bridge line is located in the corner area, and elongation of the bridge line is greater than elongation of the first line. The signal wiring is embodied as the first line and the bridge line connected to each other. Since the bridge line is located in the corner area, and the elongation of the bridge line is greater than that of the first line, when the display panel 100 is attached to the cover 200, the bending resistance of the signal wiring in the corner area can be improved, and creases occurring in the corner area can be prevented from breaking the signal wiring, thereby improving the yield of the display panel 100.

The above describes in detail the display panel and the display device provided in the present application. Specific examples are used in this article to illustrate the principles and implementation of the application, and the descriptions of the above examples are only used to help understand the methods and core ideas of the application; In addition, for those skilled in the art, according to the idea of the application, there will be changes in the specific implementation and the scope of application. In summary, the content of this specification should not be construed as a limitation of the application.

What is claimed is:

1. A display panel, comprising:
    a base substrate comprising a flat display area and a bending area surrounding the flat display area, wherein the flat display area comprises a first side and a second side adjoining the first side, the bending area comprising a first bending area bent along the first side, a second bending area bent along the second side, and a corner area located between the first bending area and the second bending area; and
    at least a signal wiring disposed on the base substrate and comprising a first line and a bridge line connected to the first line, wherein the first line is located in the first bending area, the bridge line is located in the corner area, and elongation of the bridge line is greater than elongation of the first line;
    wherein the display panel further comprises two signal wirings spaced apart from each other, wherein one of the signal wirings is a scan signal control line and the other is an emission signal control line, wherein the display panel further comprises a first gate driver on array (GOA) circuit and a second GOA circuit arranged in the bending area, the first GOA circuit is connected to the scan signal control line, and the second GOA circuit is connected to the emission signal control line; wherein the second GOA circuit is disposed on a side of the first GOA circuit away from the flat display area, the scan signal control line is disposed between the first GOA circuit and the second GOA circuit, and the emission signal control line is arranged on a side of the second GOA circuit away from the flat display area.

2. The display panel of claim 1, wherein the bridge line comprises at least a first bridge line, at least a second bridge line, and at least a third bridge line connecting with the first bridge line and the second bridge line, and the second bridge line is connected to the first line;
wherein the first bridge line is arranged parallel to the first side, and the second bridge line is arranged parallel to the second side.

3. The display panel of claim 2, wherein a first distance is defined between an end of the first bridge line connected to the third bridge line and the second side, and a second distance is defined between an end of the second bridge line connected to the third bridge line and the first side;
wherein each of the first distance and the second distance is greater than 0.2 millimeters (mm), and a difference between the first distance and the second distance is less than 0.1 mm.

4. The display panel of claim 2, wherein the signal wiring further comprises a second line, wherein the second line is located in the second bending area and is connected to the first line, the first line and the second line are disposed in a same layer, and the first line and the bridge line are disposed in a different layer.

5. The display panel of claim 4, wherein an angle defined between the third bridge line and the second bridge line is equal to an angle defined between the third bridge line and the first bridge line.

6. The display panel of claim 4, further comprising a plurality of signal wirings, wherein among the plurality of signal wirings, a plurality of first bridge lines are arranged in parallel, a plurality of second bridge lines are arranged in parallel, and a plurality of third bridge lines are arranged in parallel.

7. The display panel of claim 4, further comprising a gate metal layer and a first source-drain metal layer, wherein the gate metal layer is disposed on the base substrate, and the first source-drain metal layer is disposed on a side of the gate metal layer away from the base substrate;
wherein the first line and the second line are disposed in the same layer as the gate metal layer, the bridge line is disposed in a same layer as the first source-drain metal layer, and the first line and the second line are connected to the bridge line through corresponding first contact holes, respectively.

8. The display panel of claim 7, further comprising an interlayer dielectric layer disposed on the gate metal layer, wherein the first source-drain metal layer is disposed on a side of the interlayer dielectric layer away from the base substrate, and each of the first contact holes extends through the interlayer dielectric layer to a side of the first line or the second line away from of the base substrate.

9. The display panel of claim 4, further comprising a gate metal layer, a capacitor metal layer, a first source-drain metal layer, and a second source-drain metal layer, wherein the gate metal layer is disposed on the base substrate, the capacitor metal layer is arranged on a side of the gate metal layer away from the base substrate, and the first source-drain metal layer is disposed on a side of the capacitor metal layer away from the base substrate, and the second source-drain metal layer is disposed on a side of the first source-drain metal layer away from the base substrate;
wherein each of the first line and the second line is disposed in a same layer as the gate metal layer or the capacitor metal layer, the bridge line is disposed in a same layer as the first source-drain metal layer or the second source-drain metal layer, and the first line and the second line are connected to the bridge line through corresponding second contact holes, respectively.

10. The display panel of claim 9, further comprising an interlayer dielectric layer disposed on the capacitor metal layer, and a first planarization layer disposed on the interlayer dielectric layer and covering the first source-drain metal layer, wherein the second source-drain metal layer is disposed on a side of the first planarization layer away from the base substrate, and each of the second contact holes extends through the first planarization layer to a side of the first line or the second line away from the base substrate.

11. The display panel of claim 1, wherein at least a groove is located on the bridge line.

12. The display panel of claim 11, wherein a plurality of grooves are located at the bridge line and pass through the bridge line and are arranged in a straight line pattern er in a chain like pattern on the bridge line.

13. The display panel of claim 1, wherein the first GOA circuit is disposed in the first bending area and the second bending area, and the second GOA circuit is disposed in the first bending area and the second bending area.

14. The display panel of claim 1, further comprising a positioning mark located in the corner area.

15. The display panel of claim 14, wherein a distance between the positioning mark and the bridge line in an extending direction of the first side is greater than 0.2 microns, and a distance between the positioning mark and the bridge line in an extending direction of the second side is greater than 0.2 microns.

16. A display device, comprising a display panel and a cover, wherein the cover is disposed on the display panel, and the display panel is the display panel of claim 1.

17. The display device of claim 16, wherein the bridge line comprises a first bridge line, a second bridge line, and a third bridge line connecting with the first bridge line and the second bridge line, and the second bridge line is connected to the first line;
wherein the first bridge line is arranged parallel to the first side, and the second bridge line is arranged parallel to the second side.

18. The display device of claim 17, wherein a first distance is defined between an end of the first bridge line connected to the third bridge line and the second side, and a second distance is defined between an end of the second bridge line connected to the third bridge line and the first side;
wherein each of the first distance and the second distance is greater than 0.2 millimeters (mm), and a difference between the first distance and the second distance is less than 0.1 mm.

19. A display panel, comprising:
a base substrate comprising a flat display area and a bending area surrounding the flat display area, wherein the flat display area comprises a first side and a second side adjoining the first side, the bending area comprising a first bending area bent along the first side, a second bending area bent along the second side, and a corner area located between the first bending area and the second bending area; and at least a signal wiring disposed on the base substrate and comprising a first line and a bridge line connected to the first line, wherein the first line is located in the first bending area, the bridge line is located in the corner area, and elongation of the bridge line is greater than elongation of the first line;

wherein the display panel further comprises two signal wirings spaced apart from each other, wherein one of the signal wirings is a scan signal control line and the other is an emission signal control line, wherein the display panel further comprises a first gate driver on array (GOA) circuit and a second GOA circuit arranged in the bending area, the first GOA circuit is connected to the scan signal control line, and the second GOA circuit is connected to the emission signal control line;

wherein the first GOA circuit is disposed in the first bending area and the second bending area, and the second GOA circuit is disposed in the first bending area and the second bending area.

20. The display panel of claim 19, wherein the bridge line comprises a first bridge line, a second bridge line, and a third bridge line connecting with the first bridge line and the second bridge line, and the second bridge line is connected to the first line;

wherein the first bridge line is arranged parallel to the first side, and the second bridge line is arranged parallel to the second side.

* * * * *